United States Patent
Quek et al.

(10) Patent No.: US 6,403,485 B1
(45) Date of Patent: Jun. 11, 2002

(54) METHOD TO FORM A LOW PARASITIC CAPACITANCE PSEUDO-SOI CMOS DEVICE

(75) Inventors: Elgin Quek, Singapore (SG); Ravi Sundaresan, San Jose, CA (US); Yang Pan; James Lee Yong Meng, both of Singapore (SG); Ying Keung, Hong Kong (HK); Yelehanka Ramachandramurthy Pradeep; Jia Zhen Zheng, both of Singapore (SG); Lap Chan, San Francisco, CA (US)

(73) Assignee: Chartered Semiconductor Manufacturing Ltd, Singapore (SG)

( * ) Notice: Subject to any disclaimer, the term of this patent is extended or adjusted under 35 U.S.C. 154(b) by 0 days.

(21) Appl. No.: 09/846,177

(22) Filed: May 2, 2001

(51) Int. Cl.[7] .............................................. H01L 21/302
(52) U.S. Cl. ........................ 438/692; 438/694; 438/696; 438/700; 438/704
(58) Field of Search ................................ 438/692, 694, 438/700, 719, 724, 753, 656, 704

(56) References Cited

U.S. PATENT DOCUMENTS

| | | | |
|---|---|---|---|
| 5,275,960 A | 1/1994 | Yamaguchi et al. | 437/41 |
| 5,683,924 A * | 11/1997 | Chan et al. | 438/300 |
| 5,731,239 A * | 3/1998 | Wong et al. | 438/296 |
| 5,827,768 A | 10/1998 | Lin et al. | 438/300 |
| 5,843,826 A | 12/1998 | Hong | 438/300 |
| 6,001,697 A | 12/1999 | Chang et al. | 438/299 |
| 6,015,740 A | 1/2000 | Milic-Strkalj | 438/300 |
| 6,093,628 A * | 7/2000 | Lim et al. | 438/592 |
| 6,143,613 A * | 11/2000 | Lin | 438/299 |
| 6,171,910 B1 * | 1/2001 | Hobbs et al. | 438/275 |
| 6,239,472 B1 * | 5/2001 | Shenoy | 257/408 |

* cited by examiner

Primary Examiner—Benjamin L. Utech
Assistant Examiner—Binh X. Tran
(74) Attorney, Agent, or Firm—George O. Saile; Rosemary L. S. Pike (57) ABSTRACT

A method of forming a pseudo-SOI device having elevated source/drain (S/D) regions that can be extended for use as local interconnect is described. Shallow trench isolation (STI) regions separating adjacent active regions are provided within a semiconductor substrate. Polysilicon gate electrodes and associated SID extensions are fabricated in and on the substrate in the active regions wherein a hard mask layer overlies each of the gate electrodes. Dielectric spacers are formed on sidewalls of each of the gate electrodes. A polysilicon layer is deposited overlying the gate electrodes and the substrate. The polysilicon layer is polished back with a polish stop at the hard mask layer. The polysilicon layer is etched back whereby the polysilicon layer is recessed with respect to the gate electrodes. Thereafter, the polysilicon layer is etched away overlying the STI regions where a separation between adjacent active areas is desired. If a local interconnect is desired between adjacent active areas, the polysilicon layer is not etched away overlying the STI region separating those active areas. The hard mask layer is removed. Ions are implanted and driven in to form elevated S/D regions within the polysilicon layer adjacent to the gate electrodes to complete formation of transistors having elevated S/D regions.

27 Claims, 6 Drawing Sheets

METHOD TO FORM A LOW PARASITIC CAPACITANCE PSEUDO-SOI CMOS DEVICE

BACKGROUND OF THE INVENTION (1) Field of the Invention

The invention relates to the fabrication of integrated circuit devices, and more particularly, to a method of forming a transistor having raised source/drain regions and low parasitic capacitance in the manufacture of integrated circuits.

(2) Description of the Prior Art

Current methods of reducing source/drain capacitance typically involve forming source/drain regions over silicon-on-insulator (SOI) areas. However, SOI devices often suffer from floating body effects, which are difficult to overcome. It is desired to provide a method for forming a pseudo-SOI device which has the advantages of SOI for the source/drain regions, but which eliminates the floating body effects.

U.S. Pat. No. 5,683,924 to Chan et al teaches a method of forming elevated source/drain regions. However, this method relies on the elevation of field oxide isolation regions to define the boundaries of the polysilicon over the source/drain regions. It would be difficult to use the raised source/drain regions to also form local interconnect in this method. U.S. Pat. No. 5,275,960 to Yamaguchi et al teaches forming a a raised polysilicon source/drain region followed by formation of a T-shaped gate. U.S. Pat. No. 5,827,768 to Lin et al discloses the formation of raised source/drain regions where patterning of the polysilicon layer is performed before CMP. The S/D regions are formed by diffusion rather than by implantation. Salicidation is not possible in this method. U.S. Pat. No. 6,015,740 to Milic-Strkalj teaches a method of forming raised source/drain regions. U.S. Pat. No. 6,001,697 to Chang et al discloses a raised source/drain process. The polysilicon layer is not planarized. U.S. Pat. No. 5,843,826 to Hong shows a raised source/drain method using selective epitaxy and forming a transistor on top of the selective epitaxy.

SUMMARY OF THE INVENTION

A principal object of the present invention is to provide an effective and very manufacturable method of forming a pseudo-SOI CMOS device in the fabrication of an integrated circuit.

Another object of the present invention is to provide a method of forming a pseudo-SOI device where source/drain regions are formed on an insulator, but the transistor is formed on silicon in the fabrication of an integrated circuit.

Yet another object of the present invention is to provide a method of forming a pseudo-SOI CMOS device wherein source/drain regions can be extended for use as local interconnect.

A further object of the invention is to provide a method of forming a transistor having elevated source/drain regions that can be extended for use as local interconnect.

A still further object of the invention is to provide a method of forming a pseudo-SOI device where elevated source/drain regions are formed on an insulator, but the transistor is formed on silicon wherein the source/drain regions can be extended for use as local interconnect.

Yet another object of the present invention is to provide a method of forming a low parasitic capacitance pseudo-SOI device where elevated source/drain regions are formed on an insulator, but the transistor is formed on silicon wherein the source/drain regions can be extended for use as local interconnect.

In accordance with the objects of this invention the method of forming a pseudo-SOI device having elevated source/drain regions that can be extended for use as local interconnect is achieved. Shallow trench isolation regions separating adjacent active regions are provided within a semiconductor substrate. Polysilicon gate electrodes and associated source/drain extensions are fabricated in and on the semiconductor substrate in the active regions wherein a hard mask layer overlies each of the gate electrodes. Dielectric spacers are formed on sidewalls of each of the gate electrodes. A polysilicon layer is deposited overlying the gate electrodes and the semiconductor substrate. The polysilicon layer is polished back with a polish stop at the hard mask layer. The polysilicon layer is etched back whereby the polysilicon layer is recessed with respect to the gate electrodes. Thereafter, the polysilicon layer is etched away overlying the shallow trench isolation regions where a separation between adjacent active areas is desired. If a local interconnect is desired between adjacent active areas, the polysilicon layer is not etched away overlying the shallow trench isolation region separating those active areas. Alternatively, the source/drain regions can be extended over the shallow trench isolation regions where a contact can be made. The hard mask layer is removed. Ions are implanted and driven in to form elevated source/drain regions within polysilicon layer adjacent to the gate electrodes to complete formation of transistors having elevated source/drain regions in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
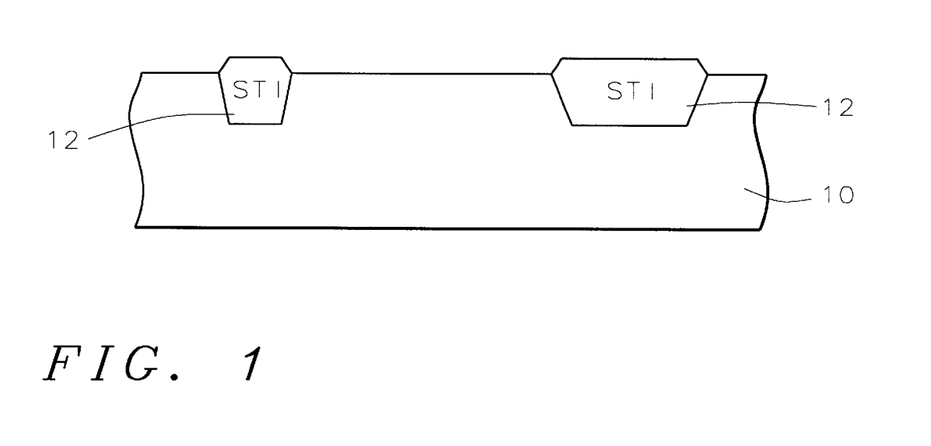
FIGS. 1 through 11 schematically illustrate in cross-sectional representation a preferred embodiment of the present invention.

Referring now more particularly to FIG. 1, there is illustrated a portion of a partially completed integrated circuit device in which there is a monocrystalline silicon semiconductor substrate 10. Shallow trench isolation (STI) regions 12 are formed as is conventional in the art.

Figure 2:
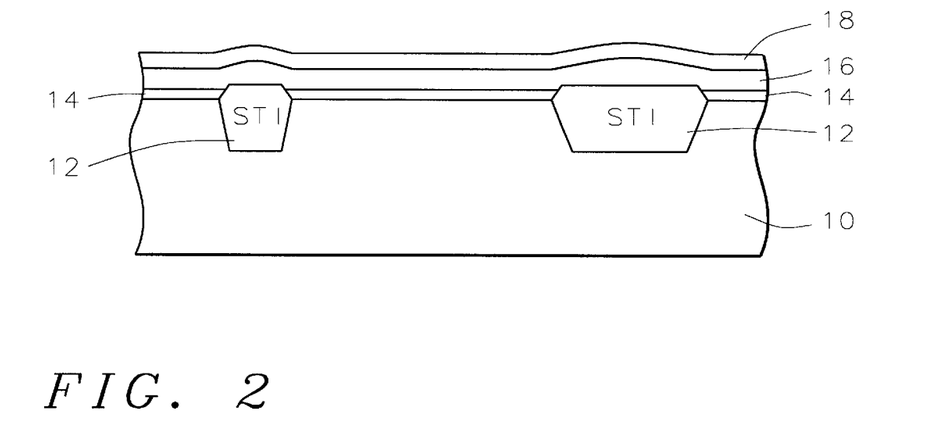

As shown in FIG. 2, a gate oxide layer 14 is deposited by chemical vapor deposition (CVD) or thermally grown over the surface of the substrate. The gate oxide layer has a thickness of between about 15 and 100 Angstroms. A layer of polysilicon 16 is deposited over the gate oxide layer to a thickness of between about 1000 and 3000 Angstroms. A hard mask layer 18, comprising silicon dioxide, silicon nitride, or silicon oxynitride, for example, is deposited over the polysilicon layer to a thickness of between about 200 and 2000 Angstroms.

Figure 3:
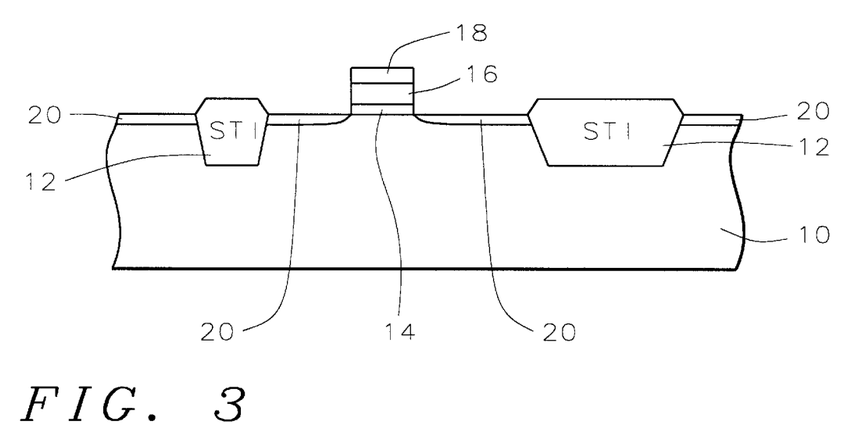

The hard mask layer is patterned as conventional and used to pattern and etch the polysilicon and gate oxide layers to form the gate electrode as shown in FIG. 3. Lightly doped source/drain extensions or LDD 20 are formed in the substrate by ion implantation using at least the gate electrode 16/18 as a mask. A separate ion implant blockout mask could also be used (NMOS and PMOS). Appropriate LDD pocket/halo implants may also be implanted.

Figure 4:
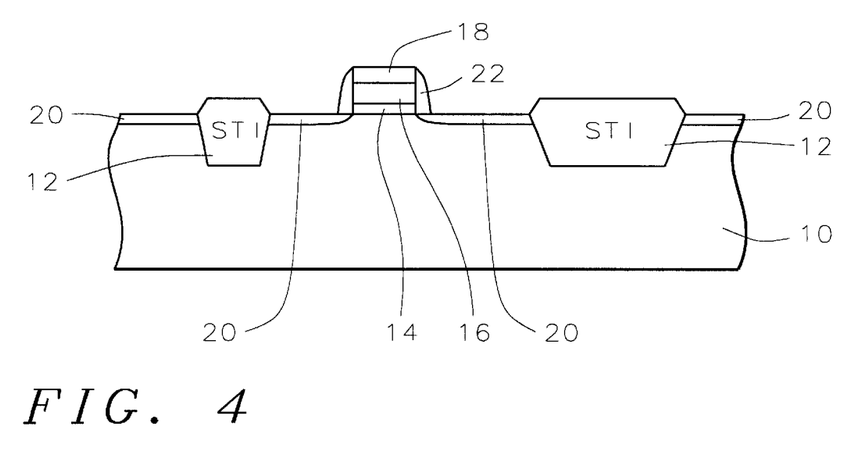

Referring now to FIG. 4, a low dielectric constant layer is deposited over the surface of the substrate and anisotropically etched away to leave spacers 22 on the sidewalls of the gate electrode. The spacer material layer should have a dielectric constant of less than 4.0.

Figure 5:
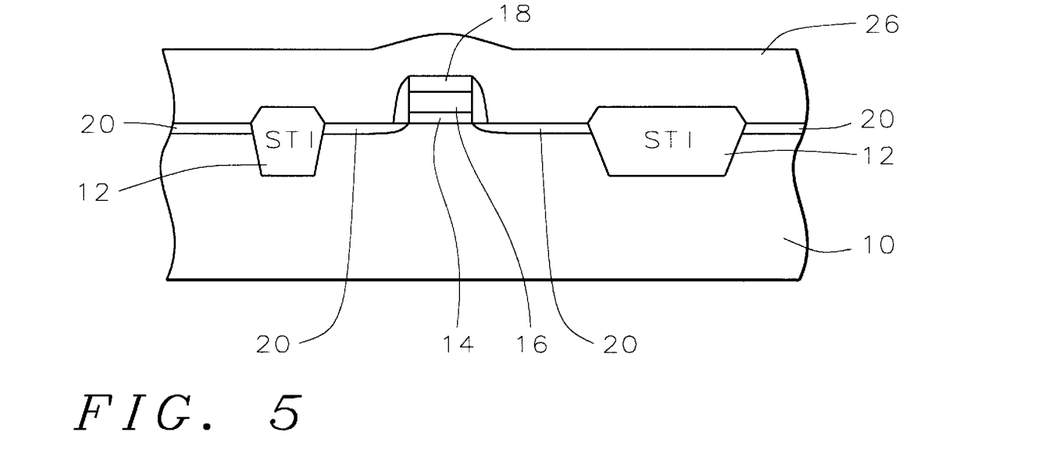

Next, any native oxide is removed from the substrate surface, especially the active regions adjacent to the gate electrode, using a hydrofluoric acid (HF) dip or vapor, for example. Then, a second layer of polysilicon 26 is deposited over the substrate to a thickness of between about 1500 and 3000 Angstroms. The polysilicon layer 26 is deposited to a height greater than the height of the gate electrode 16/18, as shown in FIG. 5.

Figure 6:
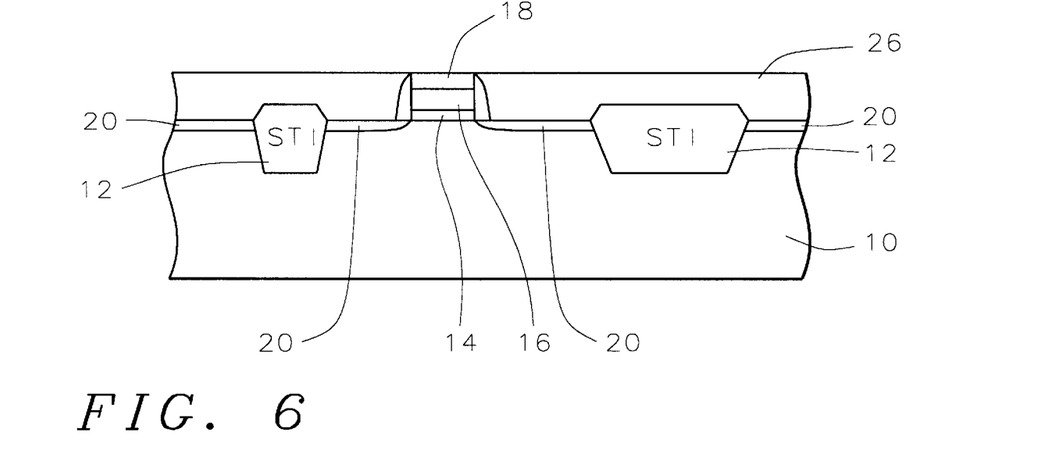

Referring now to FIG. 6, the polysilicon layer 26 is polished using chemical mechanical polishing (CMP) with a polish stop at the hard mask layer 18.

Figure 7:
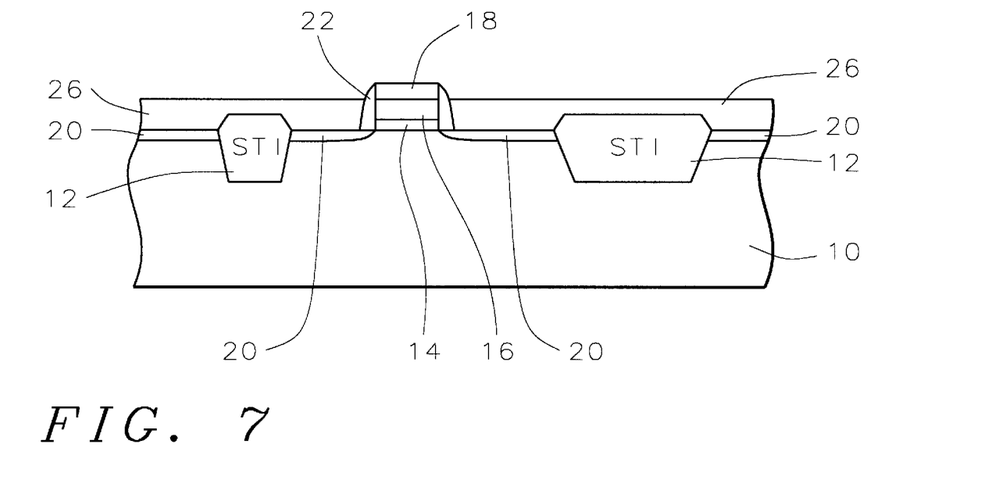

Now, the polysilicon 26 is etched slightly to recess the polysilicon layer 26 below the hard mask layer 18, as shown in FIG. 7. About one-third of the gate stack thickness after CMP is etched away from the second polysilicon layer 26.

Figure 8:
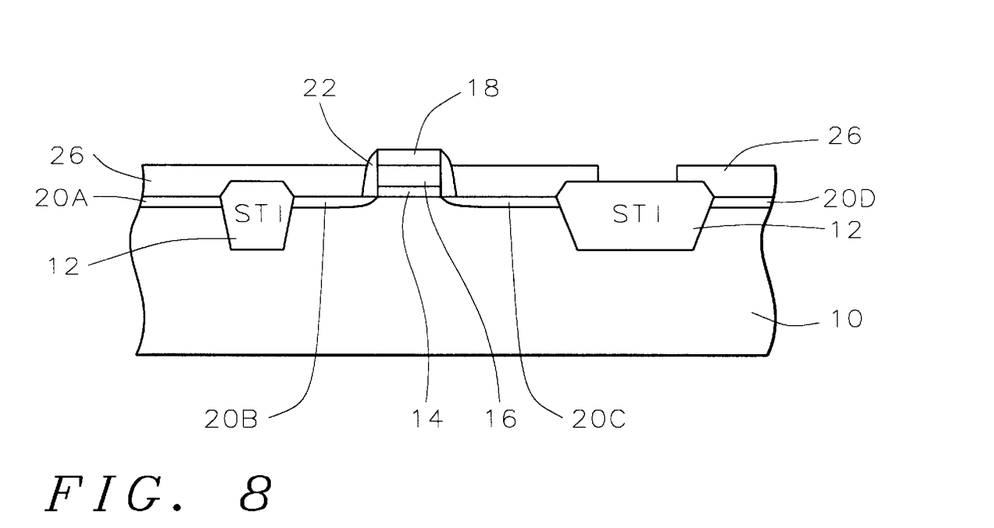

Now the polysilicon layer 26 is patterned and etched to divide the active areas by forming openings to the STI regions, as shown in FIG. 8. During this etching, the hard mask 18 protects the gate electrode 16. The polysilicon areas 26 extend partially over the STI regions. This does not increase capacitance much since the STI regions are very thick.

If it is desired to use the polysilicon region 26 as a local interconnect, it is simple to omit patterning of the polysilicon between the source/drains of two transistors that are to be connected. For example, as shown in FIG. 8, source/drains 20C and 20D are isolated from each other since the polysilicon layer has been etched away over the STI region separating 20C and 20D. On the other hand, polysilicon layer 26 forms a local interconnect between source/drain regions 20A and 20B. The process of the invention allows the polysilicon layer 26 to be used as a local interconnect without adding capacitance and leakage.

The process of the present invention uses a mask to define the source/drain polysilicon over the source/drain regions. This allows this polysilicon to be used as a salicided local interconnect between transistor source/drain regions with very much reduced parasitic capacitance and no additional junction leakage. This use of the source/drain polysilicon can significantly improve packing density. Planarity is not a concern with CMP available for subsequent dielectrics.

Figure 9:
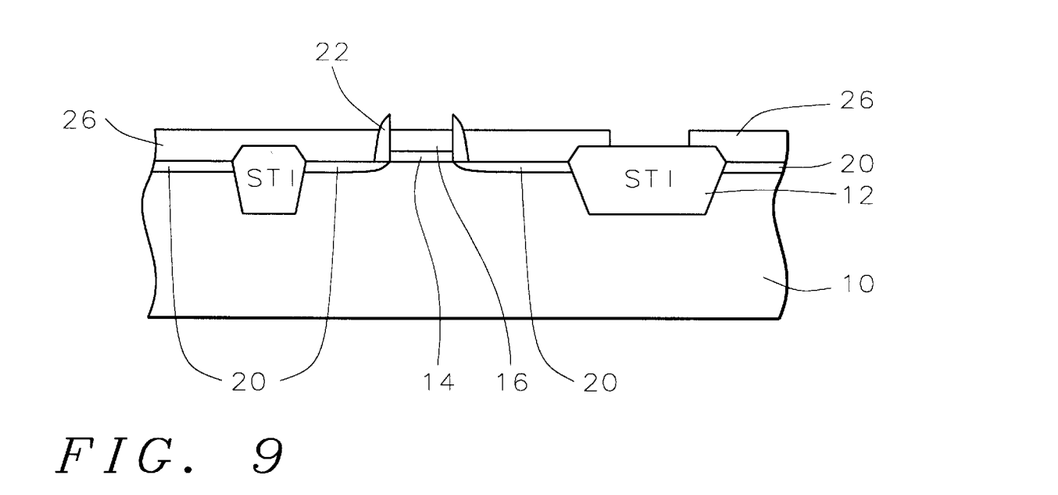

Now, the hard mask 18 is removed, for example, by hot phosphoric acid, as shown in FIG. 9.

Figure 10:
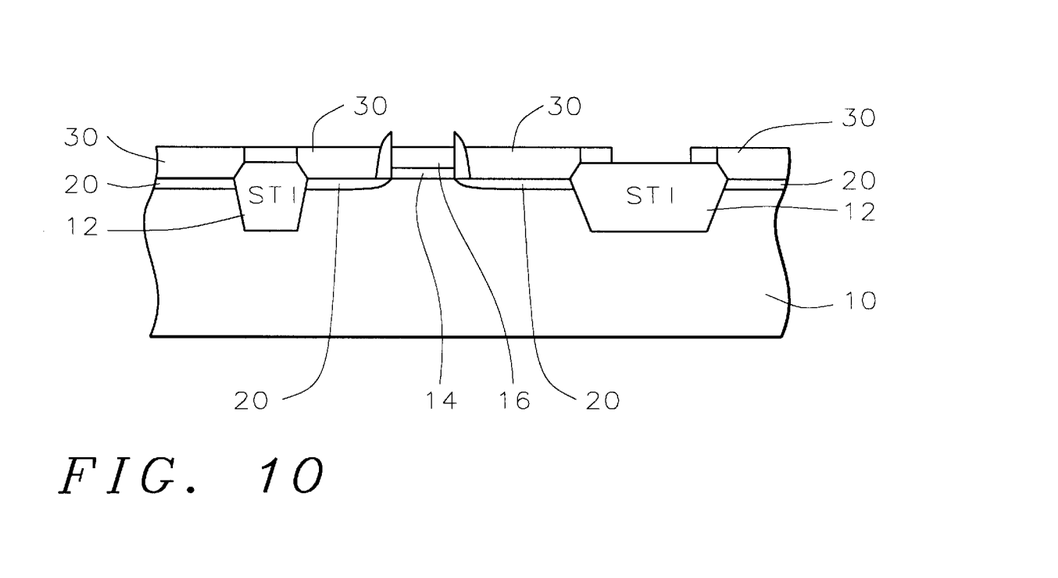

Now, the gate electrode 16 and the polysilicon layer 26 are doped by ion implantation. N-channel devices and P-channel devices are doped separately. For example, N-channel devices are doped with arsenic at a dosage of between about 2E15 to 5E15 atoms/cm$^2$ at an energy of between about 40 and 80 KeV. P-channel devices are doped with boron at a dosage of between about 2E15 to 5E15 atoms/cm$^2$ at an energy of between about 3 and 8 KeV. The dopants are activated by rapid thermal annealing at between about 1000 and 1050° C. This forms the elevated source/drain regions 30, as shown in FIG. 10. Doping by ion implantation rather than by diffusion allows for better control of dopant concentration and junction depth by adjusting dose and energy.

Figure 11:
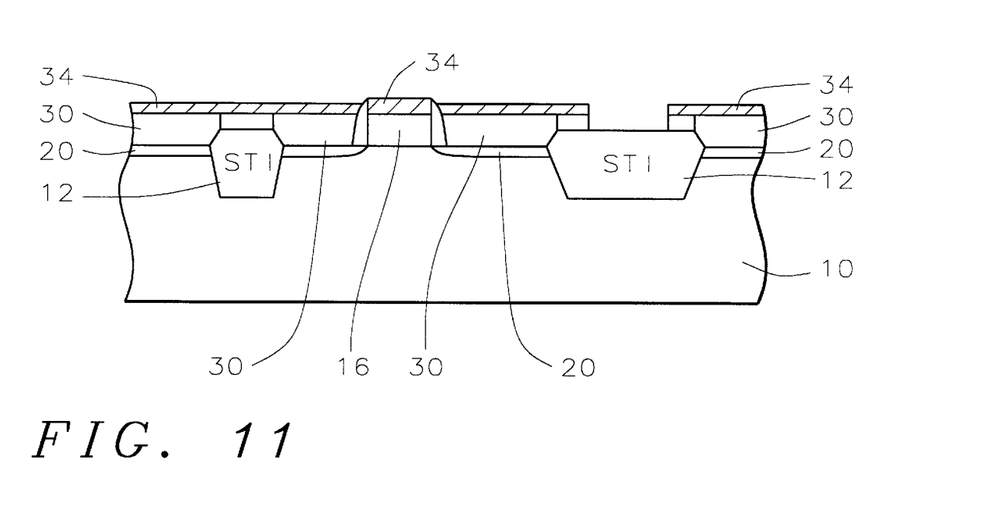

The gate 16 and source/drain regions 20 are silicided 34, as shown in FIG. 11. For example, a metal layer such as titanium is deposited over the substrate. A rapid thermal process (RTP) causes the metal to react with the underlying polysilicon to form the salicide layer 34 on the polysilicon surfaces, as shown. The unreacted metal on the spacers 22 and over the STI region 12 is etched away.

Figure 12:
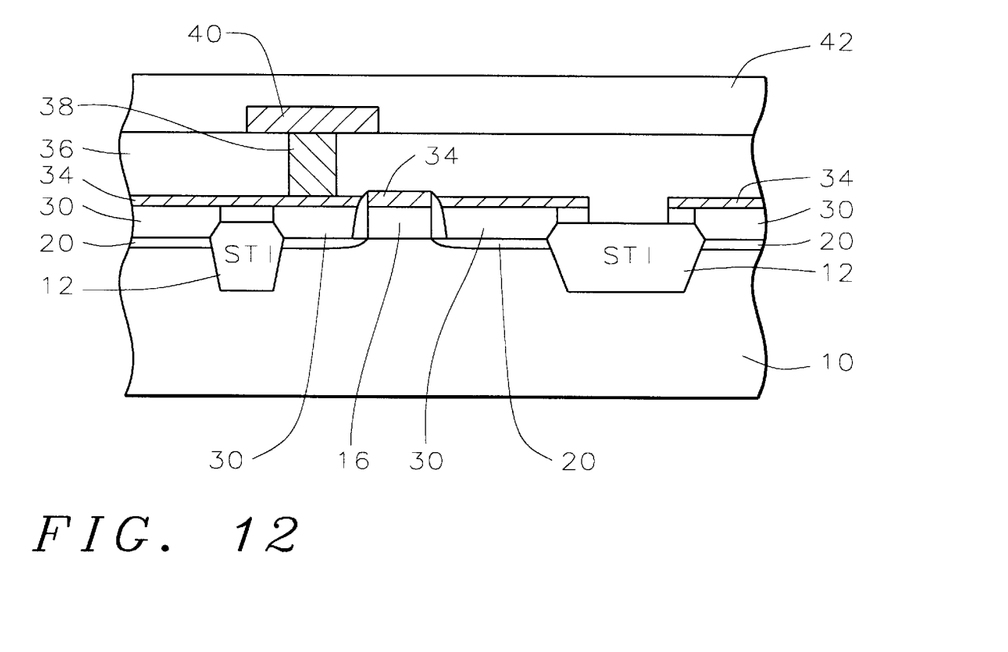
FIG. 12 schematically illustrates in cross-sectional representation a completed integrated circuit device fabricated according to a preferred embodiment of the present invention.

Processing continues as is conventional in the art. For example, FIG. 12 shows dielectric layer 36 overlying the salicided gate electrode and elevated source/drain regions. Dielectric layer 36 may be borophosphosilicate glass (BPSG), for example. Contact openings are made through the dielectric layer and electrical connections are completed. For example, metal plug 38 is shown contacting a salicided elevated source/drain region 30 and connecting to an overlying metal line 40. A passivation layer 42 completes the integrated circuit device.

The process of the present invention provides an effective and very manufacturable method for fabricating a pseudo-SOI CMOS device. The source/drain regions 30 are formed as elevated regions partially overlying oxide STI regions 12. The transistor body 16 is formed on the silicon substrate in order to avoid floating-body effects. The source/drain regions of the invention can be extended for use as local interconnects with little penalty by way of parasitic capacitance or junction leakage.

While the invention has been particularly shown and described with reference to the preferred embodiments thereof, it will be understood by those skilled in the art that various changes in form and details may be made without departing from the spirit and scope of the invention.

What is claimed is:

1. A method of forming transistors having elevated source/drain regions in the fabrication of an integrated circuit comprising:

providing shallow trench isolation regions within a semiconductor substrate wherein said shallow trench isolation regions separate adjacent active regions;

fabricating polysilicon gate electrodes and associated source/drain extensions in and on said semiconductor substrate in said active regions wherein a hard mask layer overlies each of said gate electrodes;

forming dielectric spacers on sidewalls of each of said gate electrodes;

depositing a polysilicon layer overlying said gate electrodes and said semiconductor substrate;

polishing back said polysilicon layer with a polish stop at said hard mask layer;

thereafter etching back said polysilicon layer whereby said polysilicon layer is recessed with respect to said gate electrodes;

thereafter etching away said polysilicon layer overlying said shallow trench isolation regions where a separation between adjacent active areas is desired;

thereafter removing said hard mask layer; and implanting and driving in ions to form said elevated source/drain regions within said polysilicon layer adjacent to said gate electrodes to complete formation of said transistors having elevated source/drain regions in the fabrication of said integrated circuit.

2. The method according to claim 1 wherein said hard mask layer is selected from the group consisting of silicon dioxide, silicon nitride, and silicon oxynitride and has a thickness of between about 200 and 2000 Angstroms.

3. The method according to claim 1 wherein said dielectric spacers comprise a material having a dielectric constant of less than 4.0.

4. The method according to claim 1 wherein said polysilicon layer has a thickness of between about 1000 and 3000 Angstroms.

5. The method according to claim 1 wherein said step of polishing back said polysilicon layer comprises chemical mechanical polishing.

6. The method according to claim 1 wherein said step of etching back said polysilicon layer is performed until said polysilicon layer is recessed by one third of a height of said gate electrodes.

7. The method according to claim 1 wherein said polysilicon layer is not etched away overlying said shallow trench isolation regions where local interconnects are desired between adjacent active areas.

8. The method according to claim 1 wherein said step of implanting said ions comprises implanting arsenic ions at a dosage of 2 E 15 to 5 E 15 atoms/cm$^2$ at an energy of 40 to 80 KeV into said polysilicon gate electrode and into said elevated source/drain regions to form N-channel devices.

9. The method according to claim 1 wherein said step of implanting said ions comprises implanting boron ions at a dosage of 2 E 15 to 5 E 15 atoms/cm$^2$ at an energy of 3 to 8 KeV into said polysilicon gate electrode and into said elevated source/drain regions to form P-channel devices.

10. The method according to claim 1 wherein said step of driving in said ions comprises a rapid thermal annealing at between about 1000 and 1050° C.

11. The method according to claim 1 after said step of implanting and driving in said ions further comprising siliciding said gate electrodes and said elevated source/drain regions.

12. A method of forming transistors having elevated source/drain regions in the fabrication of an integrated circuit comprising:
  providing shallow trench isolation regions within a semiconductor substrate wherein said shallow trench isolation regions separate adjacent active regions;
  fabricating polysilicon gate electrodes and associated source/drain extensions in and on said semiconductor substrate in said active regions wherein a hard mask layer overlies each of said gate electrodes;
  forming dielectric spacers on sidewalls of each of said gate electrodes;
  depositing a polysilicon layer overlying said gate electrodes and said semiconductor substrate;
  polishing back said polysilicon layer with a polish stop at said hard mask layer;
  thereafter etching back said polysilicon layer whereby said polysilicon layer is recessed with respect to said gate electrodes;
  thereafter etching away said polysilicon layer overlying said shallow trench isolation regions where a separation between adjacent active areas is desired;
  thereafter removing said hard mask layer;
  implanting and driving in ions to form said elevated source/drain regions within said polysilicon layer adjacent to said gate electrodes;
  siliciding said gate electrodes and said elevated source/drain regions;
  depositing a dielectric layer overlying said gate electrodes and elevated source/drain regions; and
  making electrical connections through openings in said dielectric layer to some of said gate electrodes and elevated source/drain regions to complete fabrication of said integrated circuit.

13. The method according to claim 12 wherein said hard mask layer is selected from the group consisting of silicon dioxide, silicon nitride, and silicon oxynitride and has a thickness of between about 200 and 2000 Angstroms.

14. The method according to claim 12 wherein said dielectric spacers comprise a material having a dielectric constant of less than 4.0.

15. The method according to claim 12 wherein said polysilicon layer has a thickness of between about 1000 and 3000 Angstroms.

16. The method according to claim 12 wherein said step of polishing back said polysilicon layer comprises chemical mechanical polishing.

17. The method according to claim 12 wherein said step of etching back said polysilicon layer is performed until said polysilicon layer is recessed by one-third of a height of said gate electrodes.

18. The method according to claim 12 wherein said polysilicon layer is not etched away overlying said shallow trench isolation regions where local interconnects are desired between adjacent active areas.

19. The method according to claim 12 wherein said step of implanting said ions comprises implanting arsenic ions at a dosage of 2 E 15 to 5 E 15 atoms/cm$^2$ at an energy of 40 to 80 KeV into said polysilicon gate electrode and into said elevated source/drain regions to form N-channel devices.

20. The method according to claim 12 wherein said step of implanting said ions comprises implanting boron ions at a dosage of 2 E 15 to 5 E 15 atoms/cm$^2$ at an energy of 3 to 8 KeV into said polysilicon gate electrode and into said elevated source/drain regions to form P-channel devices.

21. The method according to claim 12 wherein said step of driving in said ions comprises rapid thermal annealing at between about 1000 and 1050° C.

22. A method of forming transistors having elevated source/drain regions in the fabrication of an integrated circuit comprising:
  providing shallow trench isolation regions within a semiconductor substrate wherein said shallow trench isolation regions separate adjacent active regions;
  fabricating polysilicon gate electrodes and associated source/drain extensions in and on said semiconductor substrate in said active regions wherein a hard mask layer overlies each of said gate electrodes;
  forming dielectric spacers on sidewalls of each of said gate electrodes;
  depositing a polysilicon layer overlying said gate electrodes and said semiconductor substrate;
  polishing back said polysilicon layer with a polish stop at said hard mask layer;
  thereafter etching back said polysilicon layer whereby said polysilicon layer is recessed with respect to said gate electrodes;
  thereafter etching away said polysilicon layer overlying said shallow trench isolation regions where a separation between adjacent active areas is desired and not etching away said polysilicon layer overlying said shallow trench isolation regions where local interconnects are desired between adjacent active areas;
  thereafter removing said hard mask layer;
  implanting and driving in ions to form said elevated source/drain regions within said polysilicon layer adjacent to said gate electrodes;
  siliciding said gate electrodes and said elevated source/drain regions;

depositing a dielectric layer overlying said gate electrodes and elevated source/drain regions; and making electrical connections through openings in said dielectric layer to some of said gate electrodes and elevated source/drain regions to complete fabrication of said integrated circuit.

23. The method according to claim 22 wherein said hard mask layer is selected from the group consisting of silicon dioxide, silicon nitride, and silicon oxynitride and has a thickness of between about 200 and 2000 Angstroms.

24. The method according to claim 22 wherein said dielectric spacers comprise a material having a dielectric constant of less than 4.0.

25. The method according to claim 22 wherein said polysilicon layer has a thickness of between about 1000 and 3000 Angstroms.

26. The method according to claim 22 wherein said step of polishing back said polysilicon layer comprises chemical mechanical polishing.

27. The method according to claim 22 wherein said step of etching back said polysilicon layer is performed until said polysilicon layer is recessed by one-third of a height of said gate electrodes.

* * * * *

UNITED STATES PATENT AND TRADEMARK OFFICE
CERTIFICATE OF CORRECTION

PATENT NO. : 6,403,485 B1  
DATED : June 11, 2002  
INVENTOR(S) : Elgin Quek, Ravi Sundaresan, Yang Pan, James Yong Meng Lee, Ying Keung Leung, Yelehanka Ramachandramurthy Pradeep, Jia Zhen Zheng and Lap Chan

It is certified that error appears in the above-identified patent and that said Letters Patent is hereby corrected as shown below:

<u>Title page,</u>  
Item [75], delete "James Lee Yong Meng", and replace with -- James Yong Meng Lee --.  
Also delete "Ying Keung", and replace with -- Ying Keung Leung --.

Signed and Sealed this

Twenty-second Day of October, 2002

*Attest:*

*Attesting Officer*

JAMES E. ROGAN  
*Director of the United States Patent and Trademark Office*